United States Patent
Hayashi et al.

(10) Patent No.: US 11,249,394 B2
(45) Date of Patent: Feb. 15, 2022

(54) IMPRINT METHODS FOR FORMING A PATTERN OF AN IMPRINT MATERIAL ON A SUBSTRATE-SIDE PATTERN REGION OF A SUBSTRATE BY USING A MOLD, AND RELATED DEVICE MANUFACTURING METHODS

(71) Applicant: CANON KABUSHIKI KAISHA, Tokyo (JP)

(72) Inventors: Tatusya Hayashi, Utsunomiya (JP); Yosuke Murakami, Utsunomiya (JP); Noriyasu Hasegawa, Utsunomiya (JP); Hirotoshi Torii, Utsunomiya (JP); Yusuke Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 146 days.

(21) Appl. No.: 16/852,718

(22) Filed: Apr. 20, 2020

(65) Prior Publication Data
US 2020/0249569 A1 Aug. 6, 2020

Related U.S. Application Data

(60) Division of application No. 15/423,613, filed on Feb. 3, 2017, now Pat. No. 10,663,858, which is a
(Continued)

(30) Foreign Application Priority Data

Oct. 14, 2011 (JP) .................................. 2011-226637
Sep. 14, 2012 (JP) .................................. 2012-202990

(51) Int. Cl.
*G03F 7/00* (2006.01)
*B82Y 10/00* (2011.01)
(Continued)

(52) U.S. Cl.
CPC .......... *G03F 7/0002* (2013.01); *B29C 43/021* (2013.01); *B82Y 10/00* (2013.01); *B82Y 40/00* (2013.01)

(58) Field of Classification Search
CPC ..... G03F 7/0002; B29C 43/021; B82Y 40/00; B82Y 10/00
See application file for complete search history.

(56) References Cited

U.S. PATENT DOCUMENTS 7,170,589 B2   1/2007  Cherala et al.
7,298,456 B2  11/2007  Cherala et al.
(Continued)

FOREIGN PATENT DOCUMENTS

CN       1797193 A    7/2006
CN     101375209 A    2/2009
(Continued)

OTHER PUBLICATIONS

Uchida et al, JP-06204116-A, Machine Translation, Jul. 22, 1994 (Year: 1994).*
(Continued)

*Primary Examiner* — Galen H Hauth
(74) *Attorney, Agent, or Firm* — Venable LLP

(57) ABSTRACT

An imprint method for forming a pattern of an imprint material on a substrate-side pattern region of a substrate by using a mold. The method includes deforming a partial region of the substrate, the partial region corresponding to the substrate-side pattern region, by irradiating the substrate with light that has passed through the mold and has a first wavelength different from light having a second wavelength that is used for curing the imprint material, and curing the imprint material by irradiating the light having the second wavelength in a state in which the substrate-side pattern region is deformed and the mold is contacted with the
(Continued)

imprint material. The step of deforming includes forming an uneven temperature distribution on the substrate-side pattern region by irradiation of the light having the first wavelength with an uneven illumination distribution.

18 Claims, 6 Drawing Sheets

Related U.S. Application Data continuation of application No. 13/649,448, filed on Oct. 11, 2012, now Pat. No. 9,594,301.

(51) Int. Cl.
*B82Y 40/00* (2011.01)
*B29C 43/02* (2006.01)

(56) References Cited

U.S. PATENT DOCUMENTS

| | | | |
|---|---|---|---|
| 7,304,715 B2 | 12/2007 | Cadee et al. | |
| 7,372,690 B2 | 5/2008 | Moffatt | |
| 7,420,654 B2 | 9/2008 | Cherala et al. | |
| 7,595,496 B2 | 9/2009 | Ottens et al. | |
| 7,766,640 B2 | 8/2010 | Stewart et al. | |
| 8,419,995 B2 | 4/2013 | Yoneda et al. | |
| 9,201,298 B2 | 12/2015 | Nakagawa et al. | |
| 9,244,342 B2 | 1/2016 | Sato | |
| 2005/0067379 A1* | 3/2005 | Sreenivasan | G03F 9/00 216/44 |
| 2005/0199825 A1 | 9/2005 | Moffatt | |
| 2005/0270516 A1 | 12/2005 | Cherala et al. | |
| 2006/0033892 A1 | 2/2006 | Cadee et al. | |
| 2007/0035717 A1 | 2/2007 | Wu et al. | |
| 2007/0257209 A1 | 11/2007 | Ottens et al. | |
| 2011/0147970 A1 | 6/2011 | Sato | |
| 2011/0206852 A1 | 8/2011 | Shiode | |
| 2011/0273684 A1* | 11/2011 | Owa | B29C 43/003 355/53 |
| 2013/0112097 A1 | 5/2013 | Nakagawa et al. | |

FOREIGN PATENT DOCUMENTS

| | | | | |
|---|---|---|---|---|
| CN | 101393392 A | | 3/2009 | |
| CN | 102162992 A | | 8/2011 | |
| JP | 06204116 A | * | 7/1994 | ......... G03F 7/70875 |
| JP | H06-204116 A | | 7/1994 | |
| JP | 2004-259985 A | | 9/2004 | |
| JP | 2008-504141 A | | 2/2008 | |
| KR | 10-2010-0035617 A | | 4/2010 | |
| KR | 10-2011-0028071 A | | 3/2011 | |
| KR | 10-2011-0069730 A | | 6/2011 | |
| WO | 2009/153925 A1 | | 12/2009 | |

OTHER PUBLICATIONS

Korean Official Action dated Dec. 26, 2014, issued in corresponding Korean Patent Application No. 10-2012-0113324, with an English translation.

Office Action (with English translation) dated Mar. 11, 2019, issued in corresponding Chinese Patent Application No. 201510606372.3.

* cited by examiner

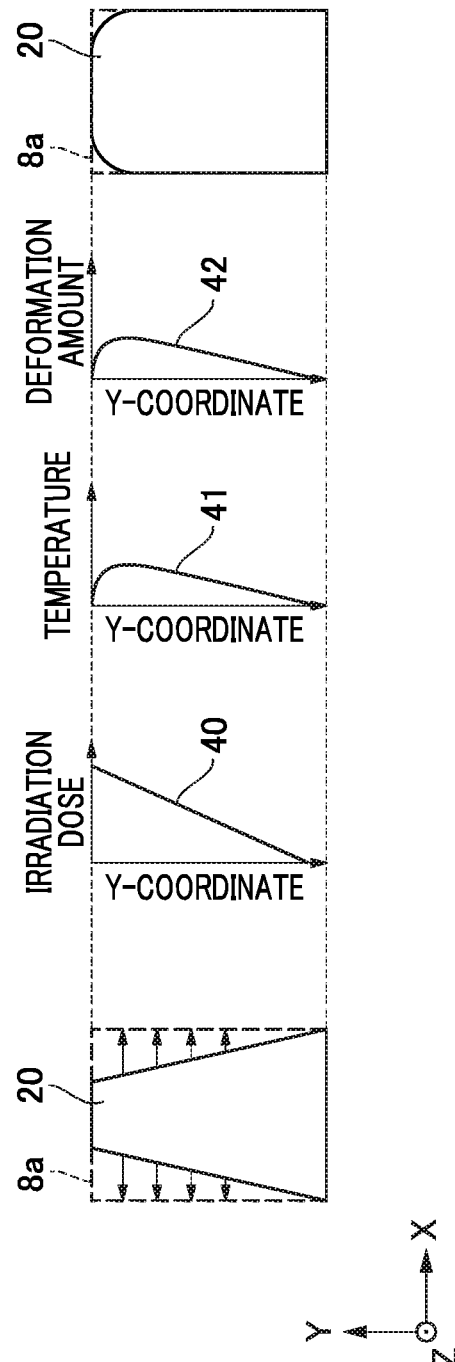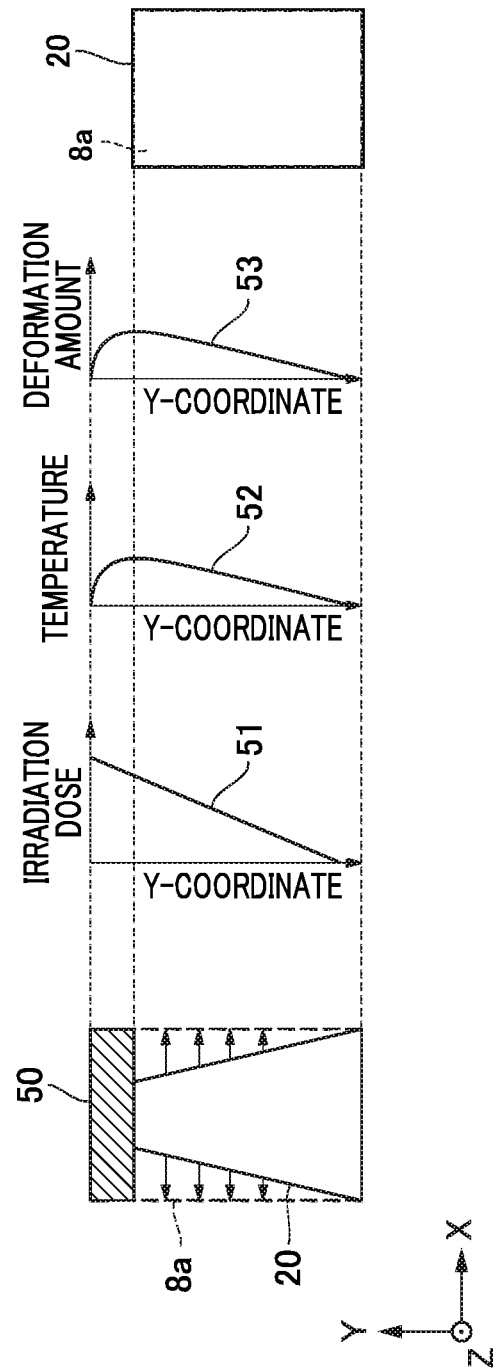

IMPRINT METHODS FOR FORMING A PATTERN OF AN IMPRINT MATERIAL ON A SUBSTRATE-SIDE PATTERN REGION OF A SUBSTRATE BY USING A MOLD, AND RELATED DEVICE MANUFACTURING METHODS

CLAIM OF PRIORITY

This application is a divisional of U.S. patent application Ser. No. 15/423,613, filed Feb. 3, 2017, which is a continuation of U.S. patent application Ser. No. 13/649,448, filed Oct. 11, 2012, now U.S. Pat. No. 9,594,301, issued Mar. 14, 2017, each of which is hereby incorporated by reference in its entirety.

This application also claims the benefit of Japanese Patent Application No. 2011-226637, filed Oct. 14, 2011, and Japanese Patent Application No. 2012-202990, filed on Sep. 14, 2012, each of which is hereby incorporated by reference in its entirety.

BACKGROUND OF THE INVENTION

Field of the Invention

The present invention relates to an imprint apparatus that forms a pattern of an imprint material on a substrate-side pattern region of a substrate using a mold, a related imprint method, and an article manufacturing method using imprint the method.

Description of the Related Art

As the demand for microfabrication of semiconductor devices or MEMS increases, not only has conventional photolithography technology, but also, microfabrication technology, in which an uncured resin on a substrate is molded by a mold to thereby form a resin pattern on the substrate, been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint material, photocurable resin) to a shot region (imprint region) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

Here, in a series of device manufacturing steps, heat processing in a film formation step, such as sputtering, is performed on a substrate to be subjected to imprint processing. Consequently, the entire substrate may be expanded or reduced, resulting in a change in the shape (or size) of the pattern region in the direction of two orthogonal in-plane axes. Thus, in an imprint apparatus, the shape of the pattern region (substrate-side pattern region) pre-formed on a substrate needs to be matched with the shape of the pattern region formed on a mold when the mold is pressed against the resin on the substrate. As a technique for making the shape of a substrate-side pattern region, which is slightly deformed, match the shape of the pattern region formed on a mold, Japanese Patent Laid-Open No. 2008-504141 discloses an apparatus that deforms a mold (pattern region) by imparting an external force to the outer periphery of the mold. In the apparatus disclosed in Japanese Patent Laid-Open No. 2008-504141, however, if the material used for the mold is quartz, the mold has a Poisson's ratio of 0.16 and, thus, if one end of the mold is pressed in the axial direction of the mold, the other end of the mold is expanded in a direction orthogonal to the axis. Thus, if such deformation occurs according to the Poisson's ratio of the mold, the plane of the mold is not easily deformed linearly, when it is desired that the mold is particularly deformed into a trapezoidal shape, resulting in adverse effects on superposition accuracy. Accordingly, as a method for preventing the mold from being deformed depending on the Poisson's ratio thereof upon such shape correction, WO 2009/153925 discloses an imprint method that makes the shape of a substrate-side pattern region match the shape of the pattern region formed on a mold by heat-deforming the mold.

If the material used for the mold is quartz, however, the thermal expansion coefficient of quartz is 0.51 ppm, whereas the thermal expansion coefficient of silicon, which is the material used for the substrate, is 2.4 ppm. The thermal expansion coefficients of the mold and the substrate differ by an order of magnitude. Thus, in the method disclosed in WO 2009/153925, the heat is transferred from the mold subjected to thermal deformation to the substrate, from the instant that the mold is pressed against the pattern formed on the substrate. Since the surface of the substrate having a relatively large thermal expansion coefficient may be largely deformed due to the heat, it is difficult to suppress adverse effects on superposition accuracy.

SUMMARY OF THE INVENTION

Accordingly, the present invention has been made in view of the foregoing circumstance and provides an imprint apparatus, an imprint method, and device manufacturing methods that are advantageous for superposition of a pre-existing pattern region formed on a substrate and a resin pattern region to be newly formed during imprint processing.

According to one aspect, the present invention provides an imprint apparatus that forms a pattern of an imprint material on a substrate-side pattern region of a substrate by using a mold. The imprint apparatus includes a heating unit configured to heat a partial region of the substrate, the partial region corresponding to the substrate-side pattern region, by irradiating the substrate with light that has passed through the mold and has a first wavelength different from light having a second wavelength for curing the imprint material. The heating unit is configured to heat the partial region to deform the substrate-side pattern region by forming an uneven temperature distribution on the substrate-side pattern region by irradiation of the light having the first wavelength with an uneven illumination distribution.

According to another aspect, the present invention provides an imprint method for forming a pattern of an imprint material on a substrate-side pattern region of a substrate by using a mold. The method includes deforming a partial region of the substrate, the partial region corresponding to the substrate-side pattern region, by irradiating the substrate with light that has passed through the mold and has a first wavelength different from light having a second wavelength for curing the imprint material, and curing the imprint material by irradiating the light having the second wavelength in a state in which the substrate-side pattern region is deformed and the mold is contacted with the imprint material. The step of deforming includes forming an uneven temperature distribution on the substrate-side pattern region by irradiation of the light having the first wavelength with an uneven illumination distribution.

According to a further aspect, the present invention provides a device manufacturing method for manufacturing a device. The method includes forming a pattern of an imprint material on a substrate-side pattern region of a substrate by using a mold under an imprint method, and processing the substrate on which an imprint material pattern has been formed to manufacture the device. The imprint method includes deforming a partial region of the substrate, the partial region corresponding to the substrate-side pattern region, by irradiating the substrate with light that has passed through the mold and has a first wavelength different from light having a second wavelength for curing the imprint material, and curing the imprint material by irradiating the light having the second wavelength in a state in which the substrate-side pattern region is deformed and the mold is contacted with the imprint material. The step of deforming includes forming an uneven temperature distribution on the substrate-side pattern region by irradiation of the light having the first wavelength with an uneven illumination distribution.

In still another aspect, the present invention provides an imprint method for forming a pattern of an imprint material on a substrate-side pattern region of a substrate by using a mold. The method includes steps of obtaining shape difference information between a mold-side pattern region of the mold and the substrate-side pattern region, deforming the mold-side pattern region by applying a force to the mold and the substrate-side pattern region by irradiating a partial region of the substrate, the partial region corresponding to the substrate-side pattern region, with light that has passed through the mold and has a first wavelength, and curing the imprint material in a state in which the imprint material on the deformed substrate-side pattern region is brought into contact with the mold by irradiating light having a second wavelength different from the first wavelength. In the step of deforming, the force and an illuminance distribution of the light are controlled based on the obtained shape difference.

In yet another aspect, the present invention provides a device manufacturing method for manufacturing a device. The method includes forming a pattern of an imprint material on a substrate-side pattern region of a substrate by using a mold under an imprint method, and processing the substrate on which an imprint material pattern has been formed to manufacture the device. The imprint method includes steps of obtaining shape difference information between a mold-side pattern region of the mold and the substrate-side pattern region, deforming the mold-side pattern region by applying a force to the mold and the substrate-side pattern region by irradiating a partial region of the substrate, the partial region corresponding to the substrate-side pattern region, with light that has passed through the mold and has a first wavelength, and curing the imprint material in a state in which the imprint material on the deformed substrate-side pattern region is brought into contact with the mold by irradiating light having a second wavelength different from the first wavelength. In the step of deforming, the force and an illuminance distribution of the light are controlled based on the obtained shape difference.

Further features of the present invention will become apparent from the following description of exemplary embodiments with reference to the attached drawings.

BRIEF DESCRIPTION OF THE DRAWINGS

FIG. 4 is a diagram illustrating an irradiation dose distribution, or the like, with respect to a pre-existing pattern region.

FIG. 5 is a diagram illustrating another irradiation dose distribution, or the like, with respect to a pre-existing pattern region.

DESCRIPTION OF THE EMBODIMENTS

Hereafter, preferred embodiments of the present invention will now be described with reference to the accompanying drawings.

First Embodiment

Figure 1:
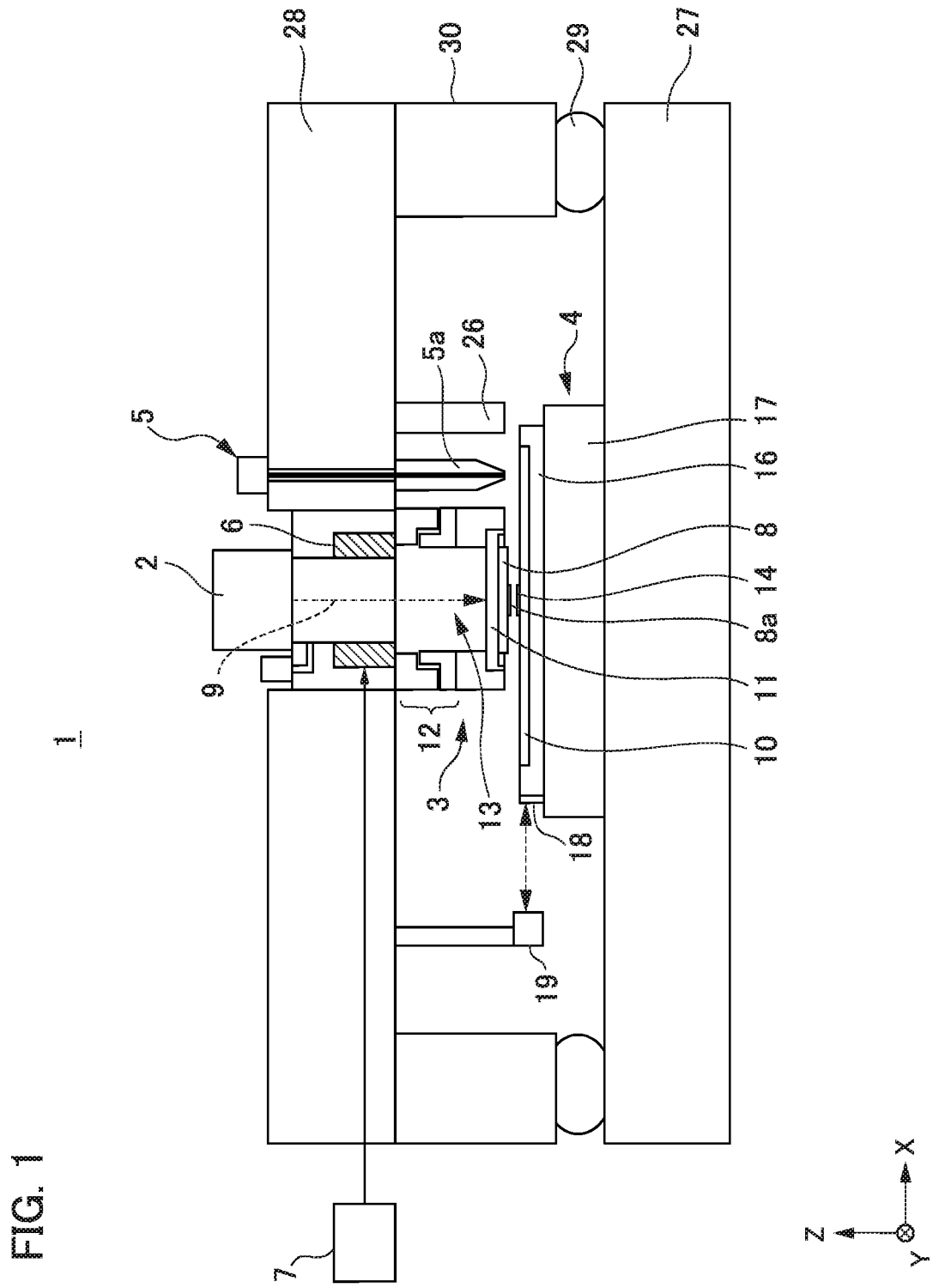
FIG. 1 is a diagram illustrating the configuration of an imprint apparatus according to a first embodiment of the present invention.

First, a description will be given of the configuration of an imprint apparatus according to a first embodiment of the present invention. FIG. 1 is a diagram illustrating the configuration of an imprint apparatus 1 of the present embodiment. The imprint apparatus 1 is an apparatus that molds an uncured resin on a wafer (on a substrate), i.e., a substrate to be treated, using a mold, to thereby form a resin pattern on the wafer, which is used in the manufacture of devices such as semiconductor devices, and the like, as articles. Note that the imprint apparatus of the present embodiment is an apparatus employing a photo-curing method. In the following drawings, a description will be given where the Z axis is aligned parallel to the optical axis of an irradiation system that irradiates a resin on a wafer with ultraviolet rays (ultraviolet light), and mutually orthogonal X and Y axes are aligned in a plane perpendicular to the Z axis. First, the imprint apparatus 1 includes a light irradiation unit 2, a mold holding mechanism 3, a wafer stage 4, an application unit 5, a wafer heating mechanism 6, and a control unit 7.

The light irradiation unit 2 irradiates a mold 8 with ultraviolet light 9 during imprint processing. The light irradiation unit 2 is constituted by a light source (not shown) and an optical element (not shown) that adjusts the ultraviolet light 9 emitted from the light source to light suitable for imprint.

The outer peripheral shape of the mold 8 is square and the mold 8 includes a pattern region (e.g., the concave and convex pattern of a circuit pattern, or the like, to be transferred) 8a, which is three-dimensionally formed on the surface facing a wafer 10. Also, the material of the mold 8 is a material through which the ultraviolet light 9 can pass and, as an example in the present embodiment, is quartz. Furthermore, for ease of deformation, as described below, the mold 8 may be of a shape in which a cavity (concave portion) of a circular planer shape having a certain depth is formed on the surface on which the ultraviolet light 9 is irradiated.

The mold holding mechanism 3 has a mold chuck 11 that holds the mold 8 and a mold drive mechanism 12 that holds the mold chuck 11, and moves the mold 8 (the mold chuck 11). The mold chuck 11 may hold the mold 8 by suctioning or attracting the outer peripheral region of the surface of the mold 8 irradiated with the ultraviolet light 9 using a vacuum suction force or an electrostatic force. For example, if the mold chuck 11 holds the mold 8 using a vacuum suction force, the mold chuck 11 is connected to an externally installed vacuum pump (not shown), and attachment/detachment of the mold 8 is switched by turning the vacuum pump ON/OFF. Also, each of the mold chuck 11 and the mold drive mechanism 12 has an aperture region 13 at the central portion (the inside thereof) such that the ultraviolet light 9 emitted from the light irradiation unit 2 is irradiated toward the wafer 10. A light transmission member (e.g., a glass plate) is installed within the aperture region 13 such that a space enclosed by a portion of the aperture region 13 and the mold 8 is sealed, and the pressure in the space is adjusted by a pressure adjusting device (not shown) including a vacuum pump, or the like. The pressure adjusting device sets the pressure in the space higher than the external pressure when the mold 8 is pressed against a resin 14 on the wafer 10, so that a pattern region 8a is deflected into a convex shape toward the wafer 10 and the pattern region 8a is brought into contact with the resin 14 from the central portion of the pattern region 8a. With this arrangement, gas (air) is prevented from being entrapped between the pattern region 8a and the resin 14, so that the resin 14 can be filled in every corner of the convex and concave portion of the pattern region 8a.

The mold drive mechanism 12 moves the mold 8 in each axis direction so as to selectively press the mold 8 against the resin 14 on the wafer 10, or to release the mold 8 from the resin 14. Examples of an actuator employable for the mold drive mechanism 12 include a linear motor, an air cylinder, and the like. Also, the mold drive mechanism 12 may be constituted by a plurality of drive systems, such as a coarse movement drive system, a fine movement drive system, and the like, in order to accommodate positioning of the mold 8 with high accuracy. Furthermore, the mold drive mechanism 12 may have a position adjustment function for adjusting the position of the mold 8, not only in the Z-axis direction, but also, in the X-axis direction, the Y-axis direction, or the θ (rotation about the Z axis) direction, a tilt function for correcting the tilt of the mold 8, and the like. The pressing operation and the releasing operation performed by the imprint apparatus 1 may be realized by moving the mold 8 in the Z-axis direction, may be realized by moving the wafer stage 4 in the Z-axis direction, or may also be realized by moving both the mold 8 and the wafer stage 4 relative to each other.

The wafer 10 is, for example, a single crystal silicon substrate or an SOI (Silicon on Insulator) substrate, and an ultraviolet curable resin, i.e., the resin 14, which is molded by the pattern region 8a formed on the mold 8, is applied on the treatment surface of the wafer 10.

The wafer stage 4 holds the wafer 10 and executes position matching between the mold 8 and the resin 14 when the mold 8 is pressed against the resin 14 on the wafer 10. The wafer stage 4 has a wafer chuck 16 that holds the wafer 10 by a suction force and a stage drive mechanism 17 that holds the wafer chuck 16 by a mechanical unit and is movable in each axis direction. Examples of an actuator employable for the stage drive mechanism 17 include a linear motor, a planar motor, and the like. The stage drive mechanism 17 may also be constituted by a plurality of drive systems, such as a coarse movement drive system, a fine movement drive system, and the like, in the X-axis and Y-axis directions. Furthermore, the stage drive mechanism 17 may also have a drive system for adjusting the position of the wafer 10 in the Z-axis direction, a position adjustment function for adjusting the position of the wafer 10 in the θ direction, a tilt function for correcting the tilt of the wafer 10, and the like. Also, the wafer stage 4 includes a plurality of reference mirrors 18 corresponding to the X-, Y-, Z-, ωx-, ωy-, and ωz-directions on the side surfaces thereof. In contrast, the imprint apparatus 1 includes a plurality of laser interferometers (length-measuring devices) 19 that measures the position of the wafer stage 4 by irradiating these reference mirrors 18 with a beam. The laser interferometer 19 measures the position of the wafer stage 4 in real time, and the control unit 7 to be described below executes positioning control of the wafer 10 (the wafer stage 4) based on the measurement value.

The application unit 5 is installed near the mold holding mechanism 3 and applies the resin (uncured resin) 14 to the wafer 10. Here, the resin 14 is a photocurable resin (imprint material) having the property of being cured by being irradiated with the ultraviolet light 9, and is appropriately selected depending on various conditions, such as the manufacturing process of semiconductor devices, or the like. The amount of the resin 14 to be ejected from the ejection nozzle 5a of the application unit 5 is also appropriately determined by a desired thickness of the resin 14 to be formed on the wafer 10, the density of the pattern to be formed, or the like.

Figure 2:
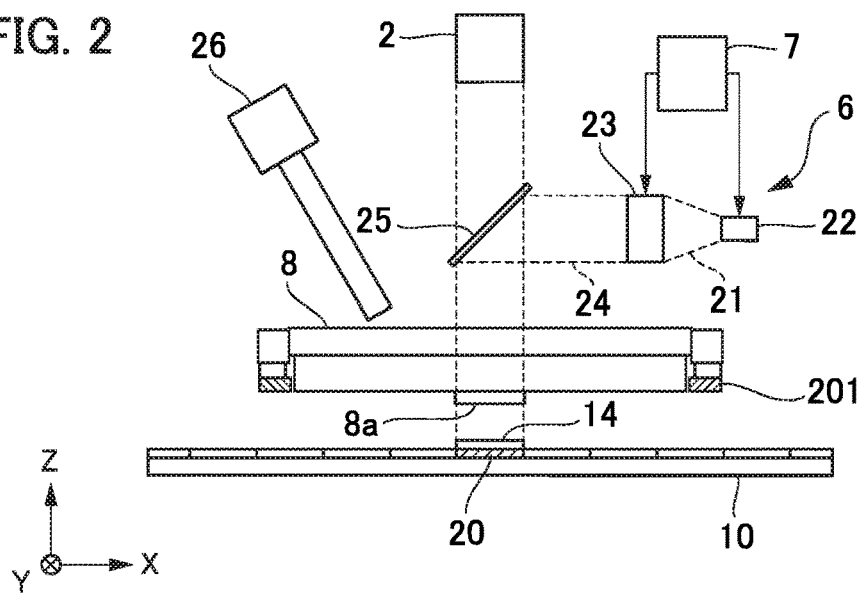
FIG. 2 is a diagram illustrating the configuration and arrangement of a wafer heating mechanism according to the first embodiment.

The wafer heating mechanism (substrate heating mechanism) 6 is capable of heating only a partial region of the wafer 10. Also, a pattern region (substrate-side pattern region) 20 serving as a portion to be treated, which pre-exists on the wafer 10 carried into the imprint apparatus 1, is heated, to thereby deform the pattern region 20 into a desired shape or a desired size. FIG. 2 is a schematic diagram illustrating the configuration and arrangement of the wafer heating mechanism 6 provided in the imprint apparatus 1, with respect to the mold 8 and the wafer 10. In FIG. 2, the same elements as those in the imprint apparatus 1 shown in FIG. 1 are designated by the same reference numerals, and the explanation thereof will be omitted. The wafer heating mechanism 6 includes a heating light source 22 that irradiates the pattern region 20 on the wafer 10 with irradiation light 21 for heating, an optical adjustor 23 that adjusts the irradiation dose of the irradiation light 21, and a reflection plate 25 that defines the optical path, such that adjusted light 24 is directed toward the surface of the wafer 10. First, it is preferable that the heating light source 22 emits light having a wavelength at which the resin 14 serving as an ultraviolet curable resin is not exposed (cured), such as light in a wavelength band of from 400 nm to 2000 nm. In particular, from the viewpoint of heating efficiency, light in a wavelength band of from 500 nm to 800 nm is more preferred. Furthermore, the heating light source 22 may also emit, not only light in the specified wavelength band, but also, ultraviolet light in a wavelength band to which the resin 14 is not very sensitive, where the wavelength band is selected from 200 nm to 400 nm at which the resin 14 is exposed, as the irradiation light 21. The optical adjustor 23 is capable of emitting only the irradiation light 21 having a specified wavelength toward the surface of the wafer 10 in order to form a desired irradiation dose distribution on at least the planar region of the pattern region 20. Examples of the optical adjustor 23 may include a liquid crystal device that is capable of changing an irradiation dose distribution by arranging a plurality of liquid crystal elements on a light-transmitting surface and individually controlling voltages to be applied to a plurality of liquid crystal elements, or a digital mirror device (digital micro mirror device) that is capable of changing an irradiation dose distribution by arranging a plurality of mirror elements on a light-reflecting surface and individually adjusting the surface directions of the mirror elements.

It is preferable that the heating light source 22 and the optical adjustor 23 are provided in the imprint apparatus 1, such that the optical path of the ultraviolet light 9 emitted from the light irradiation unit 2 is not disturbed when the resin 14 is cured. Accordingly, in the present embodiment, the heating light source 22 and the optical adjustor 23 are provided on one side of the upper surface (the light irradiation unit 2 side) of the aperture region 13, which is located on the ultraviolet light irradiation side of the mold 8, so as to emit the adjusted light 24 therefrom in the X-axis direction. In this case, the adjusted light 24 enters into a space connected to the aperture region 13, and then is reflected by the reflection plate 25. The reflected adjusted light 24 is transmitted through the mold 8 to thereby be irradiated onto the pattern region 20 that is present on the wafer 10. On the other hand, the ultraviolet light 9 emitted from the light irradiation unit 2 is transmitted through the reflection plate 25 to thereby be directly irradiated onto the wafer 10.

The control unit 7 may control the operation, adjustment, and the like, of the components of the imprint apparatus 1. The control unit 7 is constituted by a computer, or the like, and is connected to the components of the imprint apparatus 1 through a line so as to execute control of the components by a program, or the like. The control unit 7 of the present embodiment controls at least the operation of the wafer heating mechanism 6. Note that the control unit 7 may be integrated with the rest of the imprint apparatus 1 (provided in a shared housing) or may be provided separately from the rest of the imprint apparatus 1 (provided in a separate housing).

Also, the imprint apparatus 1 includes an alignment measurement system (detection unit) 26 that measures the shape or size of the pattern region 20, which is present on the wafer 10, and serves as a part to be treated, during imprint processing.

Here, a plurality of marks (not shown) is formed on the mold 8 and the wafer 10, and the alignment measurement system 26 measures the shape of the pattern region 20 by detecting these marks. In one embodiment of the present invention, four marks are formed on the mold 8 and the wafer 10, respectively, and the number of marks may be four or more. As shown in FIG. 2, the alignment measurement system 26 may also be able to measure both of the shape of the pattern region 8a formed on the mold 8 and the shape of the pattern region 20 formed on the wafer 10 during imprint processing.

Furthermore, the imprint apparatus 1 includes a base surface plate 27 on which the wafer stage 4 is placed, a bridge surface plate 28 that fixes the mold holding mechanism 3, and a column 30 that extends from the base surface plate 27 and supports the bridge surface plate 28 via a vibration isolator 29. The vibration isolator 29 eliminates vibration transmitted to the bridge surface plate 28 from the floor. Furthermore, the imprint apparatus 1 may also include a mold conveyance mechanism (not shown) that conveys the mold 8 from the exterior of the imprint apparatus 1 to the mold holding mechanism 3 and a substrate conveyance mechanism (not shown) that conveys the wafer 10 from the exterior of the imprint apparatus 1 to the wafer stage 4.

Next, a description will be given of imprint processing performed by the imprint apparatus 1. First, the control unit 7 causes a substrate conveyance mechanism to convey the wafer 10, and to place and to attach the wafer 10 to the wafer chuck 16 on the wafer stage 4. Next, the control unit 7 drives the stage drive mechanism 17 and causes it to move the pattern region 20, which is present on the wafer 10 as a pattern-forming region (a part to be treated), to the application position of the application unit 5. Next, as an application step, the control unit 7 causes the application unit 5 to apply the resin 14 to the pattern region 20. Next, the control unit 7 drives the stage drive mechanism 17 again and causes it to move the pattern region 20 such that the pattern region 20 on the wafer 10 is placed in a position directly below the pattern region 8a formed on the mold 8. Next, as a mold-pressing step, the control unit 7 drives the mold drive mechanism 12 so as to press the mold 8 against the resin 14 on the wafer 10. By pressing the mold 8 against the resin 14, the resin 14 is filled in the convex and concave portion of the pattern region 8a. Under this condition, as a curing step, the control unit 7 causes the light irradiation device 2 to emit the ultraviolet light 9 from the top surface of the mold 8, and cures the resin 14 by the ultraviolet light 9 that has been transmitted through the mold 8. Then, after the resin 14 is cured, the control unit 7 drives the mold drive mechanism 12 again to release the mold 8 from the resin 14 as a mold-releasing step. By the aforementioned steps, a three dimensionally shaped pattern (layer) of the resin 14 following the convex and concave portion of the pattern region 8a is formed on the surface of the pattern region 20 on the wafer 10. Such a sequence of imprint operations is conducted two or more times while changing the pattern-forming region under the drive of the wafer stage 4, to thereby be able to form a plurality of patterns of the resin 14 on one wafer 10.

Here, in a series of device manufacturing steps, the wafer 10 to be subjected to imprint processing is heated in a film formation step, such as sputtering, and then is conveyed into the imprint apparatus 1. Thus, the wafer 10 may be expanded or reduced before the wafer 10 is conveyed into the imprint apparatus 1, resulting in a change in the shape (or size) of the pattern region 20 in the direction of two orthogonal in-plane axes X and Y. The deformation component of the pattern region 20 is mainly classified into a magnification component, a parallelogram component, a trapezoidal component, or a combination thereof. Accordingly, when the mold 8 is pressed against the resin 14 on the wafer 10, the imprint apparatus 1 needs to correct the shape of the pattern region 20 pre-formed on the wafer 10 so as to make the shape of the pattern region 20 match the shape of the pattern region 8a formed on the mold 8. In particular, in the imprint apparatus 1 of the present embodiment, the control unit 7 calculates the correction amount of the shape of the pattern region 8a based on the measurement result obtained by the alignment measurement system 26 to thereby correct the shape of the pattern region 20 by thermal deformation.

Figure 3:
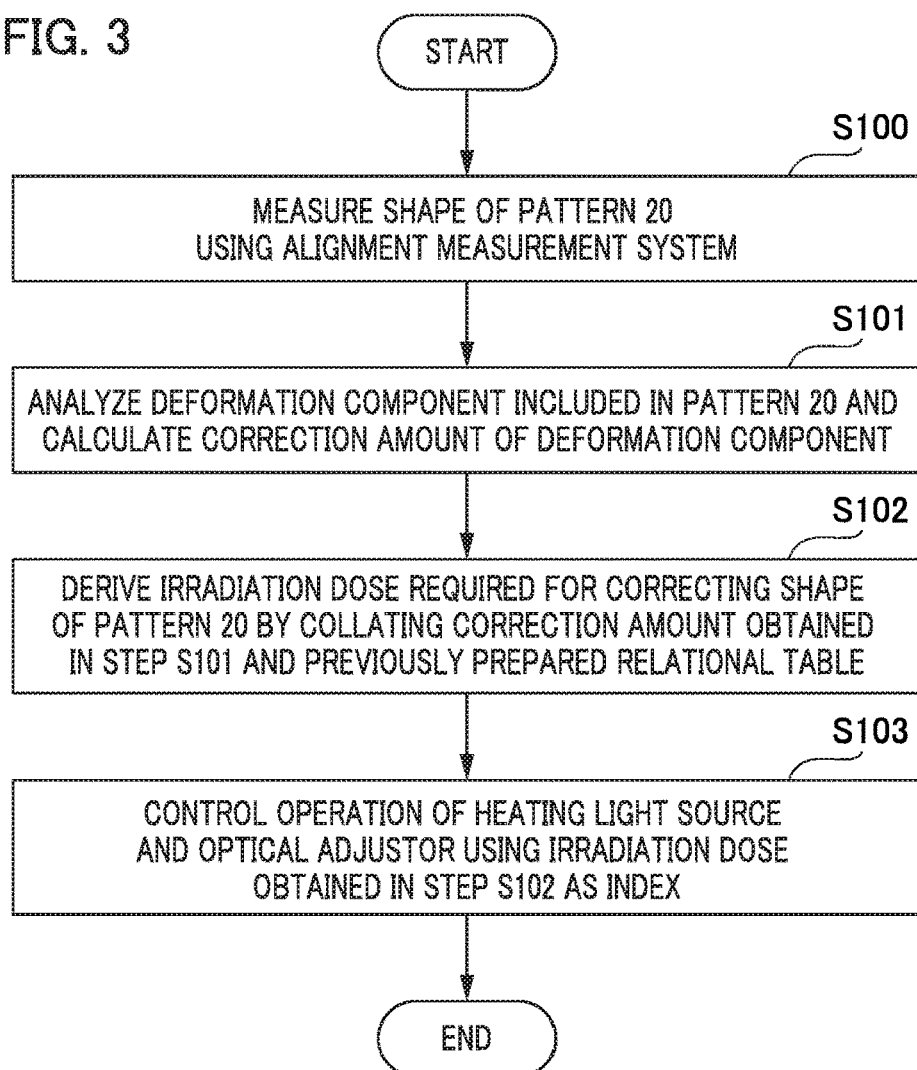
FIG. 3 is a flowchart illustrating the flow of shape correction of a pre-existing pattern region.

A general description will now be given of the flow of shape correction of the pattern region 20. In order to correct the shape of the pattern region 20, i.e., a deformation component, the imprint apparatus 1 forms a temperature distribution for obtaining a desired correction amount at the inside and the outside of the planar region of the pattern region 20. FIG. 3 is a flowchart illustrating the flow of shape correction of the pattern region 20 according to the present embodiment. The control unit 7 causes the alignment measurement system 26 to measure the shape of the pattern region 20, which is present on the wafer 10 (step S100). Next, the control unit 7 analyzes the deformation component included in the pattern region 20 based on the measurement result in step S100, and calculates the correction amount in this case (step S101). Next, the control unit 7 collates the correction amount obtained in step S101 and a previously prepared relational table of the irradiation dose corresponding to the correction amount for each deformation component pre-prepared by the heating light source 22 and the optical adjustor 23 to thereby derive the irradiation dose required for correcting the shape of the pattern region 20 (step S102). Then, the control unit 7 controls the operation of the heating light source 22 and the optical adjustor 23 using the irradiation dose obtained in step S102 as an index (step S103). At this time, an irradiation dose distribution is formed at the inside and the outside of the planar region of the pattern region 20 in response to light (the adjusted light 24) where the irradiation dose thereof is adjusted.

Here, as an example, a specific description will be given of a case when the deformation component of the pattern region 20 only includes a trapezoidal component. FIG. 4 is a schematic diagram illustrating the distribution of irradiation dose corresponding to the shape of the pattern region 20 prior to correction and after correction, and the distribution of temperature and deformation amount of the pattern region 20 in accordance with the irradiation dose. It is assumed that the pattern region 20 includes a trapezoidal component only in the Y-axis direction (Y-coordinate), and the pattern region 20 is not particularly deformed in the X-axis direction. First, in step S101, the control unit 7 recognizes that the deformation component of the pattern region 20 is a trapezoidal component, in which the upper base of the pattern region 20 in the positive Y-axis direction is narrower than the lower base thereof, having a normal width as shown in the leftmost one in FIG. 4, and simultaneously calculates a correction amount, i.e., an amount required for returning the width of the upper base back to normal. Next, in step S102, the control unit 7 collates the correction amount obtained in step S101 and the relational table to thereby derive the required irradiation dose. Then, the control unit 7 causes the heating light source 22 and the optical adjustor 23 to operate to form an irradiation dose distribution 40 for the pattern region 20 only in the Y-axis direction. At this time, since the correction width is maximized at the upper base thereof and gradually decreases from the upper base to the lower base thereof, the irradiation dose distribution 40 is linear, as shown in FIG. 4. Since it is assumed that there is no trapezoidal component deformation of the pattern region 20 in the X-axis direction, the irradiation dose in the X-axis direction is uniform. In this manner, the pattern region 20 is irradiated with the adjusted light 24 where the irradiation dose distribution 40 is adjusted, and thus, is heated with a temperature distribution 41, as shown in FIG. 4. Here, the reason why the temperature distribution 41 does not uniformly rise from the lower base to the upper base of the pattern region 20, but falls in the vicinity of the upper base thereof, is that heating is not performed in a region on the outside of the pattern region 20, resulting in a reduction of the temperature of the outer periphery of the pattern region 20 by heat radiation. Although a portion at both ends of the upper base of the pattern region 20 remains deformed, as shown in the rightmost one in FIG. 4, the pattern region 20 is heat-deformed in accordance with a deformation amount distribution 42, as shown in FIG. 4, and is corrected to a shape approximating a desired shape. Here, although the pattern region 20 is also heat-deformed in the Y direction by the input of heat into the wafer 10, a detailed description will be given of deformation mainly in the X direction. A mold shape correction mechanism 201 to be described below may correct the thermal deformation of the pattern region 20 in the Y direction.

Furthermore, in comparison with the example shown in FIG. 4, there is also another method for further improving superposition accuracy by bringing the shape of the pattern region 20 after correction further into approximation with a desired shape. FIG. 5 is a schematic diagram illustrating another example of shape correction of the pattern region 20 corresponding to that shown in FIG. 4. In the example shown in FIG. 5, the heating zone of the pattern region 20 is not limited to the planar region of the pattern region 20, but includes a region 50 positioned above the upper base of the pattern region 20. In the example shown in FIG. 4, because heating is not performed in the outer region positioned above the upper base of the pattern region 20, a portion in which the temperature falls in the temperature distribution 41 and the deformation amount decreases in the deformation amount distribution 42 occurs at the planar region of the pattern region 20. In contrast, in the example shown in FIG. 5, the region 50 is also included as a heating zone. Thus, a temperature distribution 52 and a deformation amount distribution 53 are linear with respect to an irradiation dose distribution 51, as shown in FIG. 5, at the planar region of the pattern region 20, and a portion in which the temperature falls in the temperature distribution 52 and the deformation amount decreases in the deformation amount distribution 53 does not occur at the planar region of the pattern region 20. Thus, the pattern region 20 is substantially corrected to a desired shape as shown in the rightmost one in FIG. 5.

Figure 6:
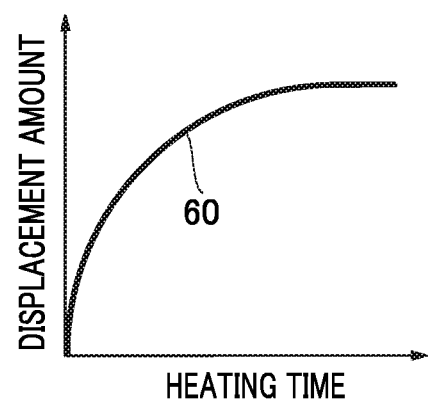
FIG. 6 is a graph plotting displacement amount with respect to heating time for a pre-existing pattern region.

For the correction of the shape of the pattern region 20 as described above, the irradiation dose of the adjusted light 24 is temporally constant, and thus, a displacement amount 60 with respect to a heating time of the pattern region 20 changes at the start of heating, but becomes stable after the elapse of a predetermined time, as shown in FIG. 6. Thus, when the displacement amount 60 of the pattern region 20 becomes stable, the control unit 7 aligns the shape of the pattern region 20 and the shape of the pattern region 8a formed on the mold 8, and proceeds to the mold-pressing step. In this manner, the imprint apparatus 1 corrects the shape of the pattern region 20, and then forms the pattern of the resin 14 on the planar region of the pattern region 20. Consequently, the shape of the pattern region 20 can be matched with the shape of the pattern region 8a with high accuracy. Here, in the conventional imprint apparatus, the mold holding mechanism 3 may have the mold shape correction mechanism 201 (magnification correction mechanism) that corrects the shape of the mold 8 (the pattern region 8a) by imparting an external force or displacement to the sides of the mold 8. In the imprint apparatus 1 of the present embodiment, the shape of the pattern region 20 can be matched with the shape of the pattern region 8a with high accuracy, as compared with the case when the trapezoidal component is corrected by deforming only the mold 8 using the conventional shape correction mechanism. In this manner, the pattern formed in the pattern region 20 and the newly-formed pattern of the resin 14 can be superposed with each other with high accuracy.

Next, in the present embodiment, a description will be given of the imprint processing including a step of deforming the shape of the mold 8 using the mold shape correction mechanism 201.

Figure 7:
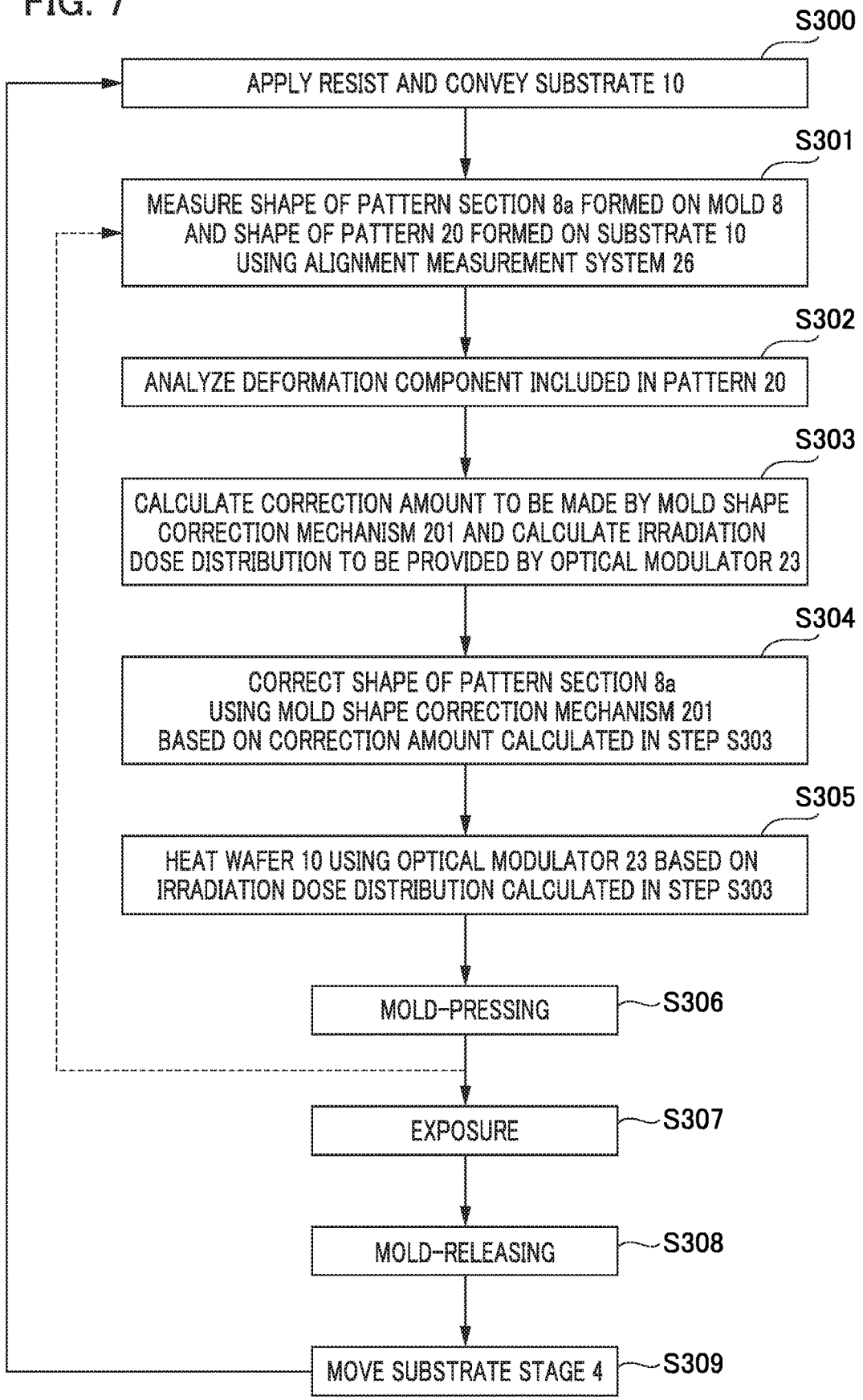
FIG. 7 is a flowchart illustrating the flow of mold shape correction.

FIG. 7 is a flowchart illustrating the imprint processing that includes a step of deforming the shape of the mold 8. First, the control unit 7 causes the substrate conveyance mechanism to convey the wafer 10 to which the resin 14 is applied under the mold 8 (step S300). Next, the control unit 7 causes the alignment measurement system 26 to measure the shape of the pattern region 8a formed on the mold 8 and the shape of the pattern region 20 formed on the wafer 10 (step S301). Next, the control unit 7 analyzes a deformation component included in the pattern region 20 based on the measurement result (information) obtained in step S301 (step S302). Here, the deformation component is a difference between the shapes of the pattern region 8a formed on the mold 8 and the pattern region 20 formed on the wafer 10. Next, the control unit 7 calculates the correction amount of the pattern region 8a to be made by the mold shape correction mechanism 201, the irradiation dose distribution, and the irradiation dose of the substrate heating light source 22, so that the difference in shapes therebetween are reduced, based on the result of analysis in step S302 (step S303). Next, the control unit 7 causes the mold shape correction mechanism 201 to correct the shape of the pattern region 8a based on the correction amount calculated in step S303 (force applying step: step S304). The control unit 7 also causes the alignment measurement system 26 to measure the shapes of the pattern region 8a and the pattern region 20 during the correction of the pattern region 8a, and always reflects the obtained measurement result on the correction amount to be made by the mold shape correction mechanism 201. After step S304, or concurrently with step S304, the control unit 7 causes a space optical modulator 23 to heat the wafer 10 based on the irradiation dose distribution calculated in step S303 to thereby correct the shape of the pattern region 20 formed on the wafer 10 (step S305). The control unit 7 causes the alignment measurement system 26 to measure the shapes of the pattern region 8a formed on the mold 8 and the pattern region 20 on the wafer 10 during the correction of the pattern region 20, and always reflects the obtained measurement result on the irradiation dose distribution to be provided by the space optical modulator 23.

After the correction of the shape of the pattern region 8a and the shape of the pattern region 20 formed on the wafer 10, a mold-pressing operation, during which the mold 8 is brought into contact with the wafer 10 via the resin 14 so that the resin 14 is filled in the concave and convex pattern of the pattern region 8a, is started (step S306). After the completion of the mold-pressing operation, as in step S301, the control unit 7 causes the alignment measurement system 26 to measure the shapes of the pattern region 8a formed on the mold 8 and a pattern region 51 formed on the wafer 10 again, and performs the operation in steps S303 and S304 again, based on the obtained remeasurement result.

Next, an exposure operation is started when ultraviolet light is emitted from the light irradiation unit 2 in order to cure the resin 14 with light (step S307). After the completion of the exposure operation, a mold-releasing operation is started to release the mold 8 from the wafer 10 (step S308). After the completion of the mold-releasing operation, the control unit 7 moves the wafer stage 4 in order to apply the resin 14 to the target position of the next shot (step S309). Heating the wafer 10 in step S305 is continued until the completion of the mold-pressing operation in step S306 and the completion of the exposure operation in step S307. Furthermore, heating the wafer 10 in step S305 may be continued until the completion of the mold-releasing operation in step S308.

The control unit 7 causes the alignment measurement system 26 to always measure the shapes of the pattern region 8a formed on the mold 8 and the pattern region 20 formed on the wafer 10 during the correction of the shapes of the pattern region 8a and the pattern region 20 formed on the wafer 10. However, in order to increase the throughput of the apparatus, the alignment measurement system 26 may measure the shapes of the pattern region 8a formed on the mold 8 and the pattern region 20 formed on the wafer 10 before all of the patterns 20 formed on the wafer 10 are subject to imprint processing. The control unit 7 calculates the correction amount of the pattern region 8a to be made by the mold shape correction mechanism 201 and the irradiation dose distribution of the space optical modulator 23, in advance, based on the obtained measurement result. In this manner, the control unit 7 can cause the alignment measurement system 26 not to measure the shapes of the pattern region 8a formed on the mold 8 and the pattern region 20 formed on the wafer 10 during imprint processing (steps S301 to S308).

Furthermore, in the present embodiment, the control unit 7 causes the mold shape correction mechanism 201 to correct the shape of the pattern region 8a (step S304) and the space optical modulator 23 to correct the shape of the pattern region 20 (step S305) prior to the start of the mold-pressing operation in step S306. Such processing is useful when the resin 14 has a particularly high viscosity, and it is contemplated that the correction amount is decreased after the pattern region 8a is brought into contact with the pattern region 20 on the substrate 10 via the resin 14.

For the correction of the shape of the pattern region 20, a description has been given of the correction for the trapezoidal component. For example, when the magnification component is corrected, the control unit 7 may control the optical adjustor 23, such that a uniform temperature distribution is formed at the inside and the outside of the planar region of the pattern region 20. Likewise, when the deformation component, such as a barrel deformation component or a pincushion deformation component is corrected, the control unit 7 may control the optical adjustor 23, such that an appropriate temperature distribution is formed in the planar region of the pattern region 20. Furthermore, for the correction of the shape of the pattern region 20, the irradiation dose distribution is formed only in the Y-axis direction of the pattern region 20. However, the irradiation dose distribution may be formed in the X-axis direction of the pattern region 20 depending on the deformation component or the irradiation dose distribution may be formed in the X-axis and Y-axis directions of the pattern region 20.

As described above, according to the present embodiment, the imprint apparatus 1, that is advantageous for superposition of the pattern formed in the pattern region 20 pre-existing on the wafer 10 and the pattern of the resin 14 to be newly formed during imprint processing, may be provided.

Second Embodiment

Next, a description will be given of an imprint apparatus according to a second embodiment of the present invention. A feature of the imprint apparatus of the present embodiment lies in the fact that an irradiation method for irradiating the adjusted light 24 used for the correction of the shape of the pattern region 20 according to the first embodiment is changed in order to improve throughput. In the imprint apparatus 1 of the first embodiment, the irradiation dose of the adjusted light 24 is constant over time. Thus, as shown in FIG. 6, a predetermined amount of time is required until the displacement amount 60 is stabilized. Accordingly, in the present embodiment, in order to bring the displacement amount of the pattern region 20 closer to a constant value faster than the displacement amount 60 of the pattern region 20 of the first embodiment, the pattern region 20 is irradiated with the adjusted light 24 in a stepwise manner during the correction of the shape of the pattern region 20.

Figure 8A:
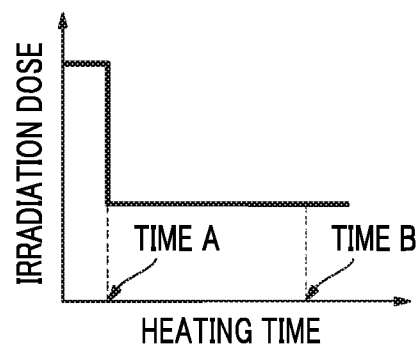
FIGS. 8A to 8C are graphs plotting irradiation dose with respect to heating time according to a second embodiment.
Figure 8B:
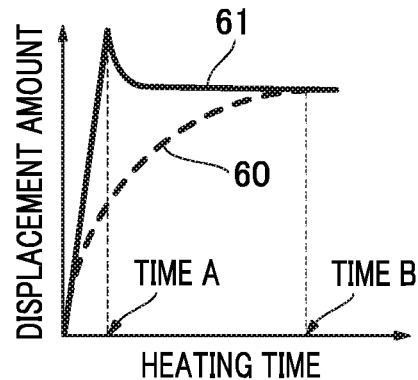
Figure 8C:
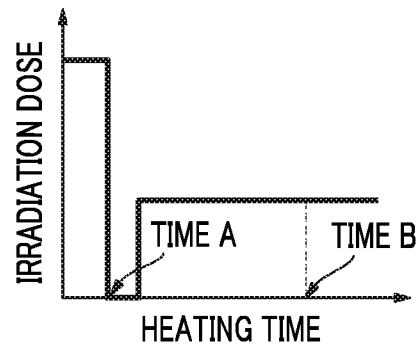

FIGS. 8A to 8C show a graph plotting the irradiation dose of the adjusted light 24 and the displacement amount obtained in this case with respect to the heating time during the correction of the shape of the pattern region 20 according to the present embodiment. In particular, FIG. 8A is a graph showing the relation between the irradiation dose irradiated in a stepwise manner and the heating time. In this case, the control unit 7 controls the irradiation dose of the adjusted light 24 such that the irradiation dose is greater than that of the first embodiment from the start of irradiation with the adjusted light 24 until the elapse of a time A, but the irradiation dose is less than that of the first embodiment after the elapse of the time A. Here, the time A is shorter than a time B (see FIG. 8B, to be described below) required for the displacement amount 60 of the first embodiment to be stabilized, but is preferably less than half the time B. FIG. 8B is graph showing the relation between the displacement amount corresponding to the irradiation dose shown in FIG. 8A and the heating time. In this case, the displacement amount 61 of the pattern region 20 rises in a short time in comparison with the displacement amount 60 of the first embodiment and the irradiation dose is optimally decreased at the time A, so that the displacement amount 61 can be stabilized in a short time. The profile of the irradiation dose of the present embodiment is not limited to a continuous profile, as shown in FIG. 8A. For example, as shown in FIG. 8C, the profile of the irradiation dose may also be an intermittent profile, such that the irradiation dose is temporarily set to zero at the time A, and a constant irradiation dose is given again after the elapse of a predetermined time.

Other Embodiments

Figure 9:
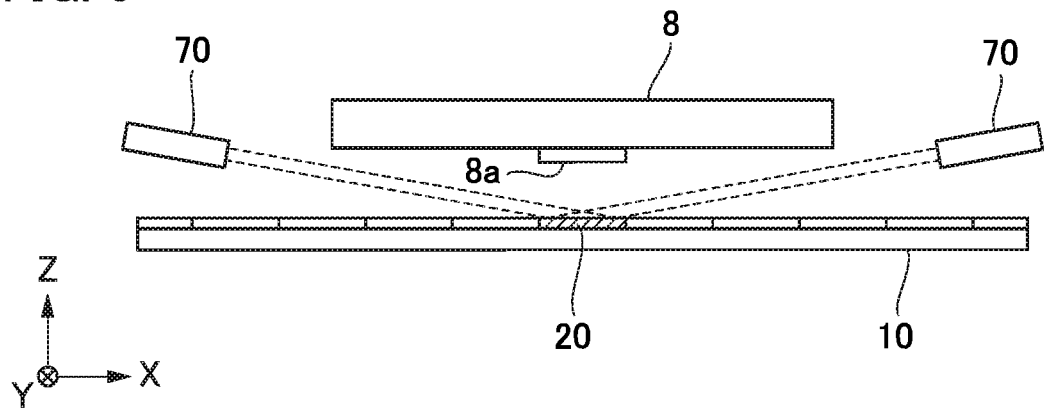
FIG. 9 is a diagram illustrating the configuration and arrangement of a wafer heating mechanism according to another embodiment.

Next, as other embodiments of the present invention, a description will be given of various other examples of the imprint apparatus of the embodiments. First, in the aforementioned embodiments, the wafer heating mechanism 6 employs the optical adjustor 23 during the correction of the shape of the pattern region 20 that is present on the wafer 10, but the present invention is not limited thereto. For example, instead of the optical adjustor 23, a plurality of heating light sources 70 that emits heating light toward the planar region of the pattern region 20 from a gap between the mold 8 and the wafer 10, as shown in FIG. 9, may also be employed. In this case, the control unit 7 appropriately adjusts the position of light that is projected onto the surface of the pattern region 20 or the heating area of the outer peripheral region thereof using a plurality of heating light sources 70 to thereby form the irradiation dose distribution and the temperature distribution onto the pattern region 20. This eliminates the need to ensure the optical path of the adjusted light 24 by disposing the reflection plate 25 in the aperture region 13, and thus, a plurality of heating light sources 70 may be readily provided in a typical imprint apparatus. Instead of employing a plurality of heating light sources 70, the wafer heating mechanism 6 may also be configured such that a heater is provided on the wafer chuck 16 so as to deform the pattern region 20 by heating with the heater. In this case, it is preferable that the heater be divided into a plurality of regions so as to form a temperature distribution in the wafer 10, and the plurality of regions are individually controlled by the control unit 7.

Furthermore, while, in the embodiment, the correction of the shape of the pattern region 20 is performed in a state in which the mold 8 is not in contact with the resin 14 on the wafer 10, the pattern region 20 may be continuously irradiated with the adjusted light 24, even when the mold 8 is in contact with the resin 14 during the mold-pressing step, in order to maintain the displacement amount 60 of the pattern region 20. Also, the correction of the shape of the pattern region 20 may be performed in parallel with the mold-pressing step or the curing step. For example, when the mold 8 is brought into contact with the wafer 10 via the resin 14 during the mold-pressing step, the heat of the pattern region 20 may be transferred to the mold 8. In this case, the deformation amount of the pattern region 20 changes due to a reduction in the temperature thereof depending on the heat capacity of the mold 8, resulting in adverse effects on superposition accuracy. In contrast, in the imprint apparatus 1 of the present embodiment, a reduction in the temperature of the pattern region 20 can be suppressed by performing the mold-pressing operation (step S306) prior to the irradiation of the wafer 10 with the adjusted light 24 (step S306) in the steps shown in FIG. 7 described in the first embodiment. When heating is performed for maintaining the shape of the pattern region 20 after the correction thereof, the value of the irradiation dose on the pattern region 20 may be less than that during the correction of the shape of the pattern region 20.

In the present embodiment, the correction of the shape of the pattern region 8a is performed by the mold shape correction mechanism 201 (step S304), and then, the mold-pressing operation is performed (step S306). However, the present invention is not limited thereto, and the shape of the pattern region 8a (step S304) and the shape of the pattern region 20 formed on the wafer 10 (step S305) may be corrected after the mold-pressing operation (step S306).

In the present embodiment, the correction amount of the pattern region 8a and the correction amount of the pattern region 20 formed on the wafer 10 are calculated, in step S303. However, the present invention is not limited thereto, and the correction amount of the pattern region 20 formed on the wafer 10 in step S303 may be calculated after the pattern region 8a is corrected, in step S304.

Article Manufacturing Method

A method of manufacturing a device (e.g., a semiconductor integrated circuit element, a liquid display element, or the like) as an article may include a step of forming a pattern on a substrate (a wafer, a glass plate, a film-like substrate, or the like) using the imprint apparatus described above. Furthermore, the manufacturing method may include a step of etching the substrate on which a pattern has been formed. When other articles, such as a patterned medium (storage medium), an optical element, or the like, are manufactured, the manufacturing method may include another step of processing the substrate on which a pattern has been formed, instead of the etching step. The article manufacturing method of the present embodiment has an advantage, as compared with a conventional article manufacturing method, in at least one of performance, quality, productivity, and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

We claim:

1. An imprint method for forming a pattern of an imprint material on a substrate-side pattern region of a substrate by using a mold, the method comprising:
   deforming a partial region of the substrate, the partial region corresponding to the substrate-side pattern region, by irradiating the substrate with light that has passed through the mold and has a first wavelength different from light having a second wavelength that is used for curing the imprint material; and
   curing the imprint material by irradiating the light having the second wavelength in a state in which the substrate-side pattern region is deformed and the mold is contacted with the imprint material,
   wherein the step of deforming includes forming an uneven temperature distribution on the substrate-side pattern region by irradiation of the light having the first wavelength with an uneven illumination distribution.

2. A device manufacturing method for manufacturing a device, the method comprising:
   (a) forming a pattern of an imprint material on a substrate-side pattern region of a substrate by using a mold under an imprint method; and
   (b) processing the substrate on which an imprint material pattern has been formed to manufacture the device,
   wherein the imprint method comprises:
   (i) deforming a partial region of the substrate, the partial region corresponding to the substrate-side pattern region, by irradiating the substrate with light that has passed through the mold and has a first wavelength different from light having a second wavelength that is used for curing the imprint material; and
   (ii) curing the imprint material by irradiating the light having the second wavelength in a state in which the substrate-side pattern region is deformed and the mold is contacted with the imprint material,
   wherein the step of deforming includes forming an uneven temperature distribution on the substrate-side pattern region by irradiation of the light having the first wavelength with an uneven illumination distribution.

3. An imprint method for forming a pattern of an imprint material on a substrate-side pattern region of a substrate by using a mold, the method comprising steps of:
   obtaining shape difference information between a mold-side pattern region of the mold and the substrate-side pattern region;
   deforming the mold-side pattern region by applying a force to the mold and the substrate-side pattern region by irradiating a partial region of the substrate, the partial region corresponding to the substrate-side pattern region, with light that has passed through the mold and has a first wavelength; and
   curing the imprint material in a state in which the imprint material on the deformed substrate-side pattern region is brought into contact with the mold by irradiating light having a second wavelength different from the first wavelength,
   wherein, in the step of deforming, the force and an illuminance distribution of the light are controlled based on the obtained shape difference.

4. The imprint method according to claim 3, wherein, in the step of obtaining, the shape difference is obtained by detecting a plurality of marks formed on the mold and a plurality of marks formed on the substrate.

5. The imprint method according to claim 4, wherein each of the mold-side pattern region and the substrate-side pattern region has a rectangular shape, and wherein, in the step of obtaining, both a number of the plurality of marks formed on the mold and a number of the plurality of marks formed on the substrate are at least four, each of the plurality of marks on the mold being disposed at a corner of the mold-side pattern, and each of the plurality of marks on the substrate being disposed at a corner of the substrate-side pattern.

6. The imprint method according to claim 3, wherein, in the step of deforming, the partial region is irradiated with light having an uneven illuminance distribution, to generate an uneven temperature distribution within the partial region.

7. The imprint method according to claim 3, wherein, in the step of deforming, the partial region is irradiated to generate a temperature distribution in the substrate-side pattern region by heating the substrate-side pattern region and an outside region, which is outside of the substrate-side pattern region and next to the substrate-side pattern region.

8. The imprint method according to claim 3, wherein, in the step of deforming, the substrate is irradiated with light having a first irradiation dose per unit time that is lower than a second irradiation dose per unit time, after the substrate is irradiated with the light having the second irradiation dose.

9. The imprint method according to claim 3, wherein, in the step of deforming, the force and the illuminance distribution are controlled based on the obtained shape difference information, so as to reduce the shape difference.

10. The imprint method according to claim 3, wherein an uncured imprint material on the substrate-side pattern region is not cured by receiving light having the first wavelength.

11. A device manufacturing method for manufacturing a device, the method comprising:
   (a) forming a pattern of an imprint material on a substrate-side pattern region of a substrate by using a mold under an imprint method; and
   (b) processing the substrate on which an imprint material pattern has been formed to manufacture the device,
   wherein the imprint method comprises steps of:
   (i) obtaining shape difference information between a mold-side pattern region of the mold and the substrate-side pattern region;
   (ii) deforming the mold-side pattern region by applying a force to the mold and the substrate-side pattern region by irradiating a partial region of the substrate, the partial region corresponding to the substrate-side pattern region, with light that has passed through the mold and has a first wavelength; and
   (iii) curing the imprint material in a state in which the imprint material on the deformed substrate-side pattern region is brought into contact with the mold by irradiating light having a second wavelength different from the first wavelength,
   wherein, in the step of deforming, the force and an illuminance distribution of the light are controlled based on the obtained shape difference.

12. An imprint method for forming a pattern of an imprint material on a substrate-side pattern region of a substrate by using a mold, the method comprising:
   applying a force to the mold to thereby deform a mold-side pattern region of the mold based on shape difference information between the mold-side pattern region and the substrate-side pattern region; and
   heating the substrate-side pattern region based on the shape difference information between the mold-side pattern region and the substrate-side pattern region and imparting an uneven temperature distribution to the substrate-side pattern region to thereby deform the substrate-side pattern region, wherein the step of applying the force to the mold and the step of heating the substrate-side pattern region are performed concurrently.

13. The imprint method according to claim 12, further comprising curing the imprint material on the substrate-side pattern region in a state when the mold-side pattern region and the substrate-side pattern region are deformed.

14. The imprint method according to claim 13, wherein the step of curing is performed in a state when a shape difference between the mold-side pattern region and the substrate-side pattern region is reduced by deforming the mold-side pattern region and the substrate-side pattern region.

15. The imprint method according to claim 12, further comprising obtaining the shape difference information between the mold-side pattern region of the mold and the substrate-side pattern region,
    wherein the step of obtaining the shape difference information is performed while the step of applying the force to the mold and the step of heating the substrate-side pattern region are being performed, and
    wherein the obtained shape difference information is reflected in the step of applying the force to the mold and the step of heating the substrate-side pattern region.

16. The imprint method according to claim 15, wherein, in the step of obtaining, the shape difference is obtained by detecting a plurality of marks formed on the mold and a plurality of marks formed on the substrate.

17. The imprint method according to claim 16, wherein each of the mold-side pattern region and the substrate-side pattern region has a rectangular shape, and
    wherein, in the step of obtaining, both a number of the plurality of marks formed on the mold and a number of the plurality of marks formed on the substrate are at least four, each of the plurality of marks on the mold being disposed at a corner of the mold-side pattern, and each of the plurality of marks on the substrate being disposed at a corner of the substrate-side pattern.

18. A device manufacturing method for manufacturing a device, the method comprising:
    (a) forming a pattern of an imprint material on a substrate-side pattern region of a substrate by using a mold under an imprint method; and
    (b) processing the substrate on which an imprint material pattern has been formed to manufacture the device,
    wherein the imprint method comprises:
    (i) applying a force to the mold to thereby deform a mold-side pattern region of the mold based on shape difference information between the mold-side pattern region and the substrate-side pattern region; and
    (ii) heating the substrate-side pattern region based on the shape difference information between the mold-side pattern region and the substrate-side pattern region and imparting an uneven temperature distribution to the substrate-side pattern region to thereby deform the substrate-side pattern region,
    wherein the step of applying the force to the mold and the step of heating the substrate-side pattern region are performed concurrently.

* * * * *